(12) United States Patent
Park et al.

(10) Patent No.: US 10,050,195 B2
(45) Date of Patent: Aug. 14, 2018

(54) RESISTIVE RANDOM ACCESS MEMORY DEVICE HAVING NANO-SCALE TIP AND NANOWIRE, MEMORY ARRAY USING THE SAME AND FABRICATION METHOD THEREOF

(71) Applicants: Seoul National University R&DB FOUNDATION, Seoul (KR); INCHEON UNIVERSITY INDUSTRY ACADEMIC COOPERATION FOUNDATION, Incheon (KR)

(72) Inventors: Byung-Gook Park, Seoul (KR); Sung Hun Jin, Gyeonggi-do (KR); Sunghun Jung, Daegu (KR); Minhwi Kim, Seoul (KR)

(73) Assignees: Seoul National University R&DB FOUNDATION (KR); INCHEON UNIVERSITY INDUSTRY ACADEMIC COOPERATION FOUNDATION (KR)

( * ) Notice: Subject to any disclaimer, the term of this patent is extended or adjusted under 35 U.S.C. 154(b) by 0 days.

(21) Appl. No.: 15/900,024

(22) Filed: Feb. 20, 2018

(65) Prior Publication Data
US 2018/0190903 A1 Jul. 5, 2018

Related U.S. Application Data

(63) Continuation of application No. 14/881,648, filed on Oct. 13, 2015.

(30) Foreign Application Priority Data

Oct. 14, 2014 (KR) .................. 10-2014-0138664
Dec. 12, 2014 (KR) .................. 10-2014-0179562

(51) Int. Cl.
| | | |
|---|---|---|
| H01L 27/088 | (2006.01) | |
| H01L 45/00 | (2006.01) | |
| H01L 27/24 | (2006.01) | |

(52) U.S. Cl.
CPC ...... *H01L 45/1273* (2013.01); *H01L 27/2472* (2013.01); *H01L 45/04* (2013.01); *H01L 45/1233* (2013.01); *H01L 45/16* (2013.01)

(58) Field of Classification Search
CPC ................. H01L 45/1273; H01L 45/1675
See application file for complete search history.

(56) References Cited

U.S. PATENT DOCUMENTS

2013/0001501 A1* 1/2013 Sills ............... H01L 45/04 257/4
2016/0141494 A1* 5/2016 Lam ............... H01L 45/08 257/4

* cited by examiner

*Primary Examiner* — Samuel Gebremariam
(74) *Attorney, Agent, or Firm* — Gerald E. Hespos; Michael J. Porco; Matthew T. Hespos

(57) ABSTRACT

A resistive random access memory device having a nano-scale tip and a nanowire is provided. A memory array using the same also is provided and fabrication method thereof. A technique is provided for forming a bottom electrode having an upwardly protruding tapered tip structure through etching a semiconductor substrate and a top electrode being formed of a nanowire and a technique forming a resistive random access memory device at a location intersected with each other in order that an area of each memory cell is minimized and that an electric field is focused on the tip of the bottom electrode across the top electrode.

3 Claims, 11 Drawing Sheets

FIG. 15(a)
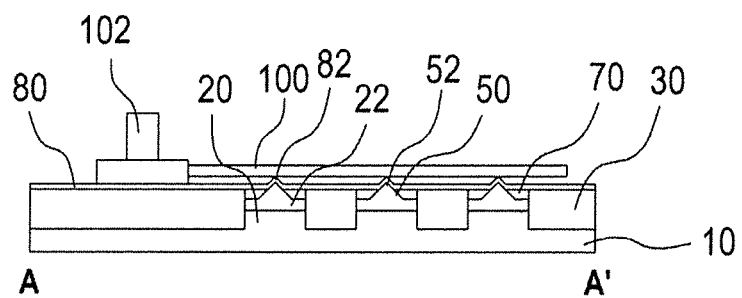
FIG. 15(b)
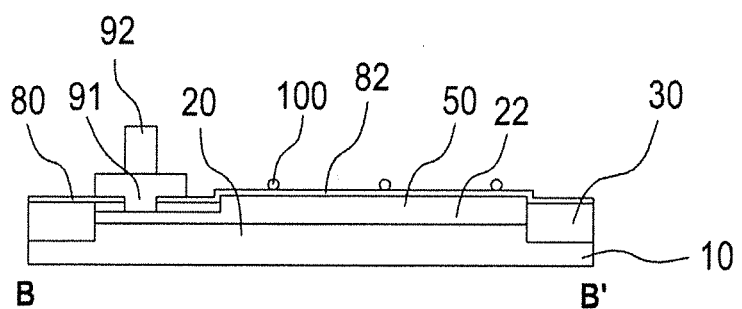
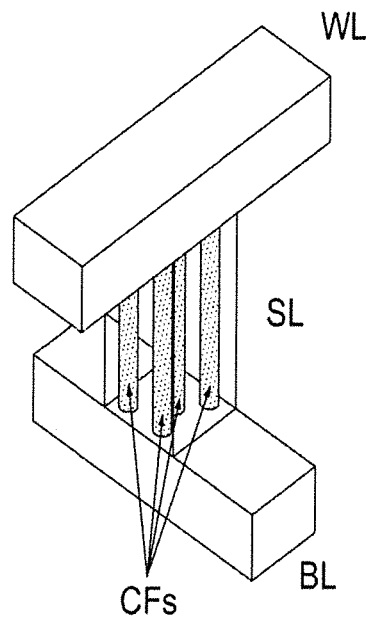
FIG. 16(a)
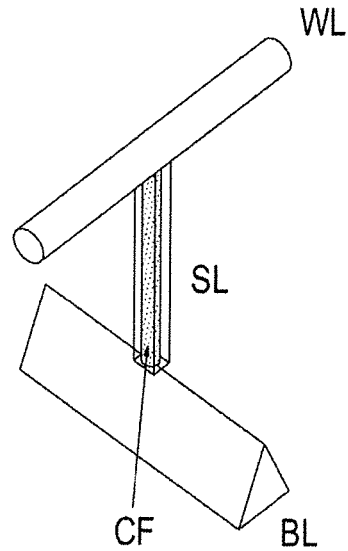
FIG. 16(b)

FIG. 17
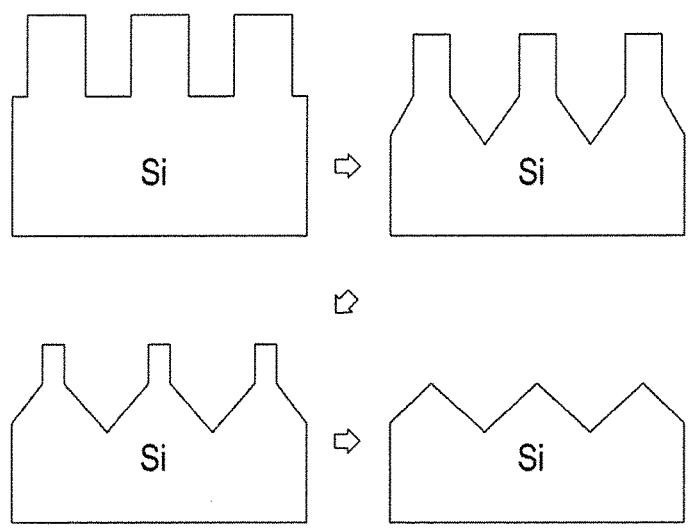
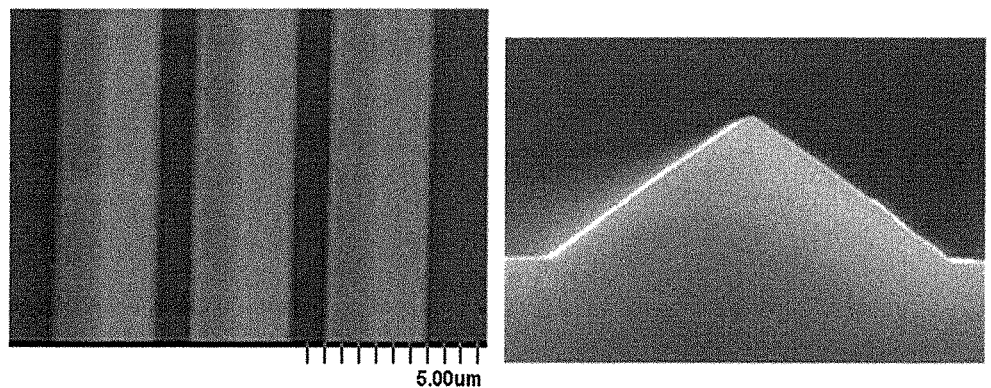
FIG. 18(a)  FIG. 18(b)

FIG. 19(a)
FIG. 19(b)
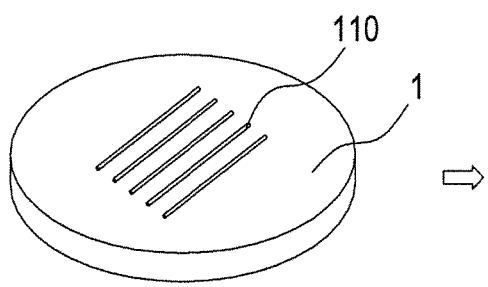
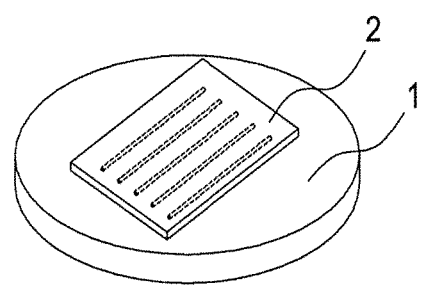
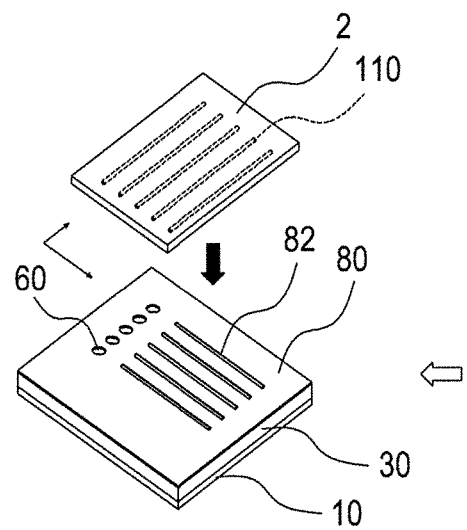
FIG. 19(d)
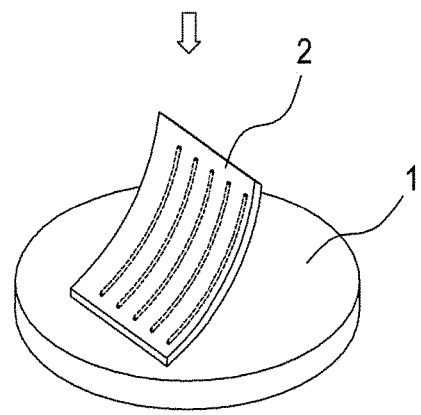
FIG. 19(c)

RESISTIVE RANDOM ACCESS MEMORY DEVICE HAVING NANO-SCALE TIP AND NANOWIRE, MEMORY ARRAY USING THE SAME AND FABRICATION METHOD THEREOF

CROSS-REFERENCE TO RELATED APPLICATION

The present application is a continuation application of U.S. patent application Ser. No. 14/881,648, filed Oct. 13, 2015, which claims priority to Korean Patent Application No. 10-2014-0138664, filed on Oct. 14, 2014, and 10-2014-0179562, filed on Dec. 12, 2014, under 35 U.S.C. 119, the entire contents of which are hereby incorporated by reference.

BACKGROUND OF INVENTION

1. Field of the Invention

The present invention relates to a resistive memory device and more particularly to a resistive random access memory (RRAM) device having a nano-scale tip and a nanowire, a memory array using the same and fabrication method thereof.

2. Description of the Related Art

At present, NAND flash memory technology leads the markets of mass information storage devices and stands up as a representative runner of the non-volatile memory by scaling down continuously. However, when the size of device is scaled down below 20 nm, the reliability problem is recently coming out. Thus, various next generation non-volatile memories have been suggested for replacing the NAND flash memory technology and studies have been actively performed.

Among them, RRAM has a simple structure and an advantage improving the reliability by scaling down. And it is expected to be a strong candidate of an alternative technology for the conventional NAND flash memory technology. As shown in FIG. 1, RRAM has basically a MIM structure consisted of a top electrode (metal)-a resistance change layer (a switch layer: insulator)-a bottom electrode (metal).

The switching operation of RRAM is divided into 3 steps: as shown in FIG. 2, in the initial state, a forming operation forming conductive filaments to be a low resistance state, a reset operation raising a resistance by cutting the conductive filaments and a set operation decreasing the resistance by reproducing the conductive filaments.

In the conventional RRAM structure, because the interface between a metal and an insulator is a plane, when voltages are applied to both ends, the electric field is uniformly distributed. So, in the forming and set operations, the conductive filaments are formed at random places and are difficult to be controled. Because of the difficulty of control for forming the conductive filaments at a wanted place, the reliability problem of RRAM occurs. This is a main obstacle in the commercialization of RRAM.

The reason of this reliability problem is that filaments are variously formed in a vertical direction due to the grain boundaries of the materials (e.g., transition metal oxides) that form the resistance change layer.

To overcome the above problem, Korean Patent No. 10-1113014 discloses an attempt to minimize the number of filaments involved into the transition by forming the resistance change layer as a spacer shape to minimize the area contacting the top electrode. Korean Patent Publication No. 10-2008-0048757 discloses an attempt to form reproducible filaments by focusing electric field through a protruding bottom or top electrode filled in a groove formed along a grain boundary of a resistance change layer. Korean Patent No. 10-1263309 discloses a technology for concentrating electric field by protruding a single top electrode toward a bottom electrode in each cell through processes for fabricating a side wall and a spacer.

However, Korean Patent No. 10-1113014 has a limit of technique for minimizing the number of filaments because the resistance change layer is formed as a spacer shape. Korean Patent Publication No. 10-2008-0048757 has difficulty in commercialization by being formed with not only a plurality of protruding parts but also a non-uniform shape because grooves are formed on the surface by the chemical etching process when the protruding part of the top electrode is formed or because the protruding part is formed of metal particles that remain after coating and evaporating the liquid mixture containing various metal particles when the protruding part of the bottom electrode is formed. Korean Patent No. 10-1263309 discloses a fabrication method that cannot form the protruding part on the bottom electrode.

As shown in FIG. 3, RRAM has a trade-off that needs a high voltage for a high speed operation due to a voltage-time dilemma due to the operation voltage and the switching time having an inversely proportional relationship. The high voltage causes a complication of circuit configuration and brings to an increasing of operation current.

Furthermore, as shown in FIG. 4, for an array of RRAM, the top and bottom electrodes configuring a word line and a bit line, respectively, have to be vertically crossed with each other. In present technology, the pitch is determined by a photolithography. However, due to the limit of lithography apparatus, a memory device having a sub 10 nm level is difficult to achieve. In order to obtain a higher integration density of a memory, it is important to reduce the pitches of the word line and the bit line and it requires new technologies to overcome the limit of the lithography technology.

SUMMARY OF THE INVENTION

The present invention provides resistive random access memory devices having a nano-scale tip and a nanowire, a memory array using the same and fabrication method thereof. RRAM devices of the present invention are configured to have the minimal size as a scale of a few nanometers, to improve the distribution of resistance values in high and low resistance states by applying a structure easily focusing an electric field, to improve the performance in a switching speed, an operation voltage and an operation current, etc., and to improve the integration density.

To achieve the objective, a resistive random access memory device according to the present invention comprises: a bottom electrode formed in a first direction by etching a semiconductor substrate, the bottom electrode having an upwardly protruding tapered tip structure; a resistance change layer formed on the bottom electrode; and a top electrode formed on the resistance change layer in a second direction across the bottom electrode, the top electrode being a nanowire passing over the tip structure.

The bottom electrode may be wrapped around by an interlayer insulating film except for an upper part of the tip structure, and wherein the resistance change layer may be formed on the upper part of the tip structure and the interlayer insulating film.

The tip structure may have a wedge shape, the wedge shape being configured to have a predetermined length in the first direction and a triangular cross-section in the second direction, and wherein the nanowire may be a metal nanowire, a carbon nanotube (CNT) or a grapheme nanoribbon.

The tip structure may have an upper end size of 10 nm or less in the second direction.

A memory array according to the present invention comprises: a semiconductor substrate; a plurality of bit lines formed in a first direction on the semiconductor substrate; and a plurality of word lines formed in a second direction across the bit lines, a resistance change layer being located between the word lines and the bit lines, wherein each of the bit lines is formed of a semiconductor line doped with an impurity, the semiconductor line having upwardly protruding tapered tip structures, and wherein each of the word lines is formed of a nanowire passing over the tip structures of the bit lines along the second direction.

The bit lines may be formed in one body with the semiconductor substrate, each of the bit lines being a bottom electrode line doped with an impurity and electrically insulated from adjacent lines with an isolation insulating film, the bottom electrode line having upwardly protruding tapered tip structures along the first direction, wherein an interlayer insulating film may be further formed between the bit lines and the resistance change layer, the interlayer insulating film wrapping around the tip structures except for upper parts of the tip structures, wherein the resistance change layer may be formed on the upper parts of the tip structures of the each bit line, the interlayer insulating film and the isolation insulating film, and wherein each of the word lines may be formed of a top electrode line passing over the tip structures of the bit lines along the second direction.

The tip structure may have a wedge shape, the wedge shape being configured to have a predetermined length in the first direction and a triangular cross-section in the second direction, and wherein the nanowire may be a metal nanowire, a carbon nanotube (CNT) or a grapheme nanoribbon.

A method for fabricating a memory array according to the present invention comprises: a first step of protruding a plurality of semiconductor lines for forming a plurality of contacts and bit lines by etching a semiconductor substrate; a second step of forming an isolation insulating film by depositing a first insulating material on the semiconductor substrate and etching the first insulating material to expose upper parts of the semiconductor lines and to be insulated from each other; a third step of forming protruding patterns on the upper parts of the semiconductor lines; a fourth step of forming upwardly protruding tapered tip structures from the protruding patterns; a fifth step of forming a plurality of contacts and bit lines on the upper parts of the semiconductor lines by an ion implantation process; a sixth step of forming a resistance change layer on the upper parts of the tip structures of the each bit line by depositing a resistance change material, and forming a plurality of contact holes that reach the each contact; and a seventh step of forming a plurality of word lines with nanowires and forming a plurality of word line contacts and a plurality of bit line contacts filled in the contact holes on the resistance change layer.

The protruding patterns of the third step may have a rectangular shape being formed with a single, and wherein the each word line of the seventh step may be vertically crossed with the each bit line having a wedge shaped tip structure.

Between the fifth step and the sixth step, that method may further include depositing a second insulating material on the upper parts of the plurality of contacts and bits lines and the isolation insulating film and etching the second insulating material and the isolation insulating film to form an interlayer insulating film with the second insulating material, the interlayer insulating film wrapping around the tip structures except for upper parts of the tip structures, wherein the second insulating material is the same as the first insulating material, and wherein the etching process of the second insulating material and the isolation insulating film is performed after a planarization process.

Each word line of the seventh step may be formed by transferring a metal nanowire, a carbon nanotube (CNT) or a graphene nanoribbon.

The forming of the tip structures of the fourth step may be by anisotropically etching the semiconductor lines and/or the protruding patterns.

The tip structures may have an upper end size of 10 nm or less in a vertical direction to the each semiconductor line.

The protruding patterns of the third step may be formed of a semiconductor material.

The protruding patterns of the third step may be etching masks.

The etching masks may be formed by one process selected from photolithography, sidewall patterning and e-beam processes.

By forming a bottom electrode having an upwardly protruding tapered tip structure through etching a semiconductor substrate and a top electrode being formed of a nanowire, a resistive random memory device is formed at a location intersected with each other. So the present invention can maximally reduce or minimize the area of each memory cell as a scale of (a few nm)×(a few nm). Thus, it is possible to significantly improve the resistance value distribution in a high resistance state and a low resistance state. It is also possible to reduce the operation voltage and current and to improve the switching speed and the integration density of the whole array.

In addition, the present invention can form a bottom electrode having a very sharp tapered tip structure with an end size of a scale of a few nanometers by an anisotropic etching and easily form a top electrode by a nanowire transferring method. Thus, it is totally possible to design a highly compatible process with the conventional silicon process for ensuring effectively the ease of process, the economic respects of process and the high yield of process.

BRIEF DESCRIPTION OF THE DRAWINGS

FIGS. 15A and 15B are cross sectional views taken along lines AA' and BB' in FIG. 14.

FIGS. 16A and 16B are comparison diagrams. FIG. 16A is showing a structure of the conventional resistive random memory device. FIG. 16B is showing a structure of a resistive random memory device according to an embodiment of the present invention.

FIG. 17 is a process concept diagram showing processes fabricating a wedge shaped tip structure by an anisotropic etching without etching masks after silicon is patterned as a fin shape.

FIGS. 18A and 18B shows an implementable structure by a fabricating process of a memory array according to an embodiment of present invention. FIGS. 18A and 18B are showing a nano-wedge shaped tip structure and its enlarged cross-sectional view, respectively.

FIGS. 19A-19D show a process concept diagram showing an example of forming word lines by transferring carbon nanotubes in a vertical direction against the tip structure on a nano-wedge shaped tip structure by a fabricating process of a memory array according to an embodiment of present invention.

In these drawings, the following reference numbers are used throughout: reference number 10 indicates a semiconductor substrate, 20 a semiconductor line, 22 a bottom electrode or a bit line, 30 an isolation insulating film, 40 a protruding pattern, 50 a tip structure, 52 an upper part of the exposed tip structure, 60 a contact hole, 70 an interlayer insulating film, 80 a resistance change layer, 82 and 84 a protruding part of a resistance change layer, 92 a bit line contact plug, 100 a top electrode or a word line and 110 a carbon nano tube.

DETAILED DESCRIPTION

Detailed descriptions of preferred embodiments of the present invention are provided below with reference to accompanying drawings.

First, a detailed description of a resistive random memory device according to an embodiment of the present invention is provided with reference to FIGS. 5 to 16B.

A resistive random access memory device according to an embodiment of the present invention, as exemplarily shown in FIGS. 14 to 16B, comprises: a bottom electrode formed in a first direction by etching a semiconductor substrate 10, the bottom electrode (BL) 22 having an upwardly protruding tapered tip structure 50; a resistance change layer (SL) 80 or 82 formed on the bottom electrode; and a top electrode (WL) 100 formed on the resistance change layer in a second direction across the bottom electrode (BL) 22, the top electrode 100 being a nanowire passing over the tip structure 50.

Here, the semiconductor substrate 10 may be silicon or other semiconductor such as germanium, etc. And, referring to FIGS. 5 to 11B, the bottom electrode (BL) 22, as described later, may be formed of a conductive line having an opposite conductivity type to the semiconductor substrate 10 by an ion implantation process on a semiconductor line 20 formed from the semiconductor substrate 10 by etching it. Thus, if the semiconductor substrate 10 is a P-type substrate, the bottom electrode (BL) 22 can be formed of an N-type conductive line. Of cause, the opposite can be also formed.

The bottom electrode (BL) 22, as shown in FIGS. 15A, 15B, 16A and 16B, has an upwardly protruding tapered tip structure 50.

The tip structure 50 can have a polygonal cone shape, a conical cone shape or a wedge shape as shown in FIG. 16. In case that the tip structure 50 has the wedge shape, it may be configured to have a predetermined length in the first direction and a triangular cross-section in the second direction. Thus, it is preferred in a fabricating process that the tip structure 50 has the wedge shape for the top electrode (WL) 100 formed of a nanowire.

Because the tip structure 50 is formed to be tapered upwardly and to have a sharp upper end, the upper end size (i.e., minimum width) in the second direction (i.e., the direction of the top electrode (WL) 100) can be less than a few nanometers, as an example, 10 nm or less.

Figure 14:
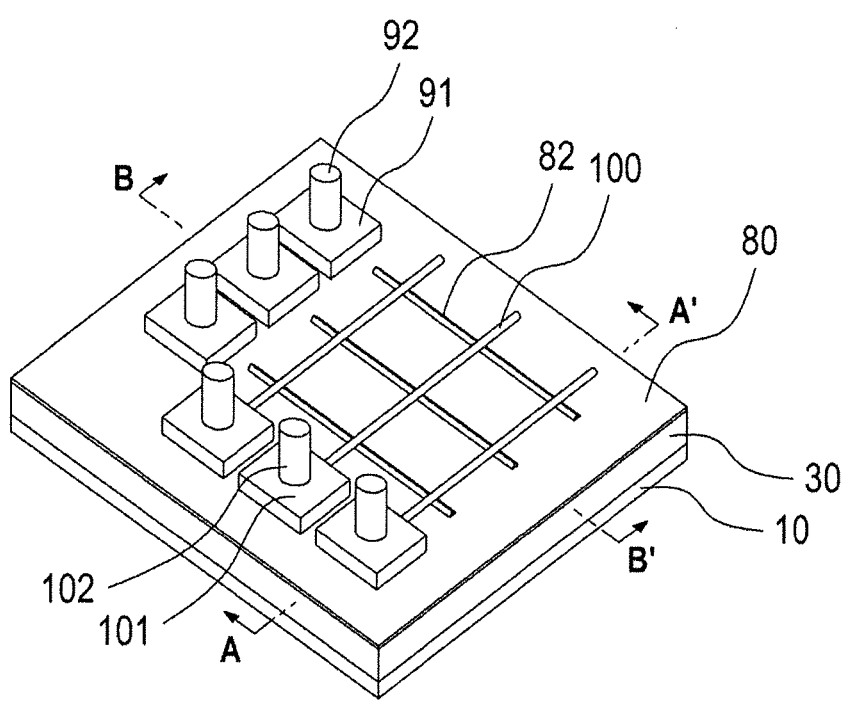
Figure 20:
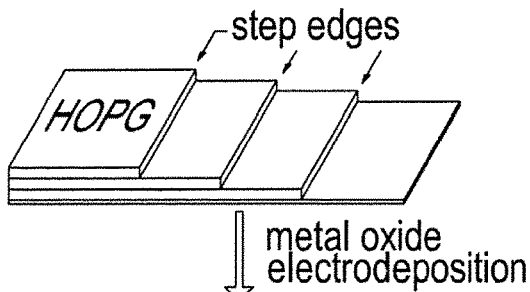
FIGS. 20A-20C, 21A and 21B are redrawn from the contents published in CHEMPHYSCHEM 2003, 4, pp. 131-138 and show that metal nanowires can be regularly formed by using the steps of HOPG layers. The metal nanowires are transferred to form word lines in a memory array according to the present invention.
Figure 20B:
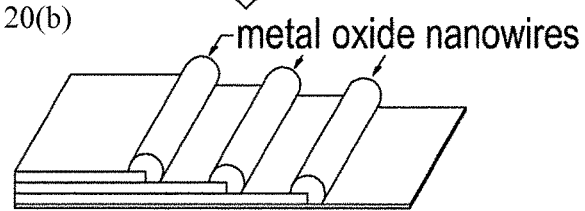
Figure 20C:
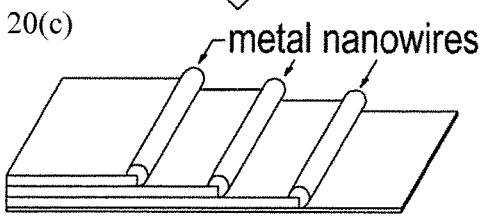
Figure 21A:
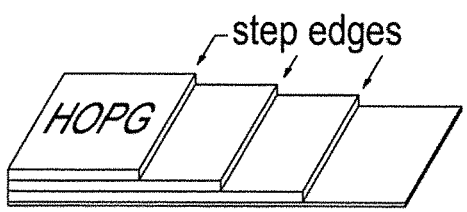
Figure 21B:
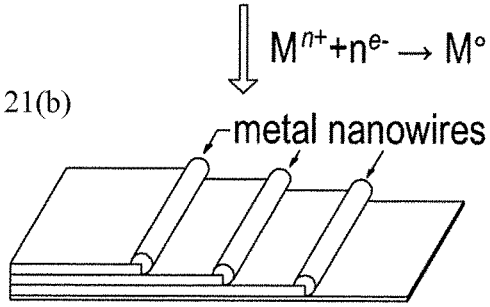

It is preferred that the top electrode (WL) 100 is also, as shown in FIG. 14, formed of a nanowire with a diameter less than several tens nm. The nanowire may be a metal nanowire, a carbon nanotube (CNT) or a grapheme nanoribbon.

Thus, as shown in FIG. 16B, it is possible that a top electrode (WL) 100 and a bottom electrode (BL) 22 are across each other at an area maximally minimized and an electric field can be focused to the upper end of the tip structure 50 of a bottom electrode (BL) 22. Thus, it is possible to solve the chronic reliability problem by forming a single conductive filament (CF) as shown in FIG. 16B or at least minimal numbers much less than those of the conventional resistive random memory device as shown in FIG. 16A in a resistance change layer (SL) 82.

Figure 11A:
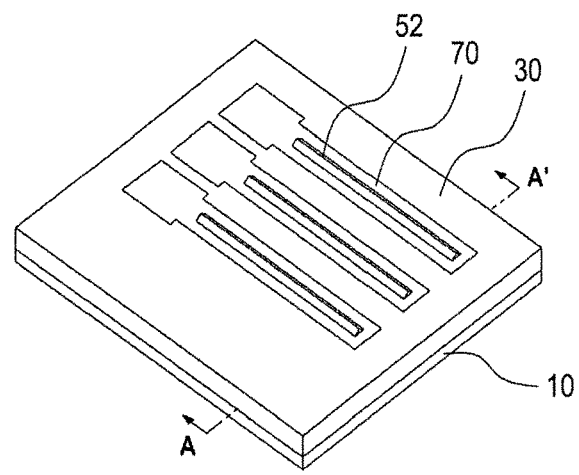
Figure 11B:
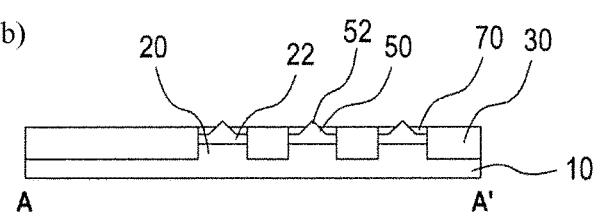

The bottom electrode (BL) 22, as shown in FIGS. 11A and 11B, preferably can be wrapped around by an interlayer insulating film 70 except for an upper part 52 of the tip structure 50, and the resistance change layer 80 preferably can be formed on the upper part 52 of the tip structure and the interlayer insulating film 70.

Here, the interlayer insulating film 70 can be a known insulating film such as a silicon oxide film when the semiconductor substrate is a silicon substrate, but as described later, it is preferable that the interlayer insulating film 70 is formed of an isolation insulating film used to isolate semiconductor lines.

Because the interlayer insulating film 70 enables the exposed range of the upper part of the tip structure 50 to be determined by adjusting the stacking thickness of the insulating film, it is possible to secondarily and more effectively restrict a region where conductive filaments are formed.

The resistance change layer 80 also may be formed of a known resistance change material by depositing to the thickness more than the height of the tip structure 50 exposed on the interlayer insulating film 70 and planarizing the upper part by the planarization process, etc. and then the top electrode 100 may be formed (not shown). However, but it is preferable that the resistance change layer 80 is formed to be upwardly protruded on the tip structure 50 as shown in FIG. 12 and the top electrode 100 is formed to wrap the protruding part 82 of the resistance change layer as shown in FIG. 15A.

Next, a detailed description of a memory array according to an embodiment of the present invention is provided.

A memory array according to an embodiment of the present invention is using the above mentioned resistive random access memory device of the present invention as a unit cell device and, as shown in FIGS. 14, 15A and 15B, and comprises: a semiconductor substrate 10; a plurality of bit lines 22 formed in a first direction on the semiconductor substrate 10; and a plurality of word lines 100 formed in a second direction across the bit lines 22, a resistance change layer 80 being located between the word lines 100 and the bit lines 22, wherein each of the bit lines 22 is formed of a semiconductor line dopied with an impurity, the semiconductor line having upwardly protruding tapered tip structures 50, and wherein each of the word lines 100 is formed of a nanowire passing over the tip structures 50 of the bit lines 22 along the second direction.

Figure 7:
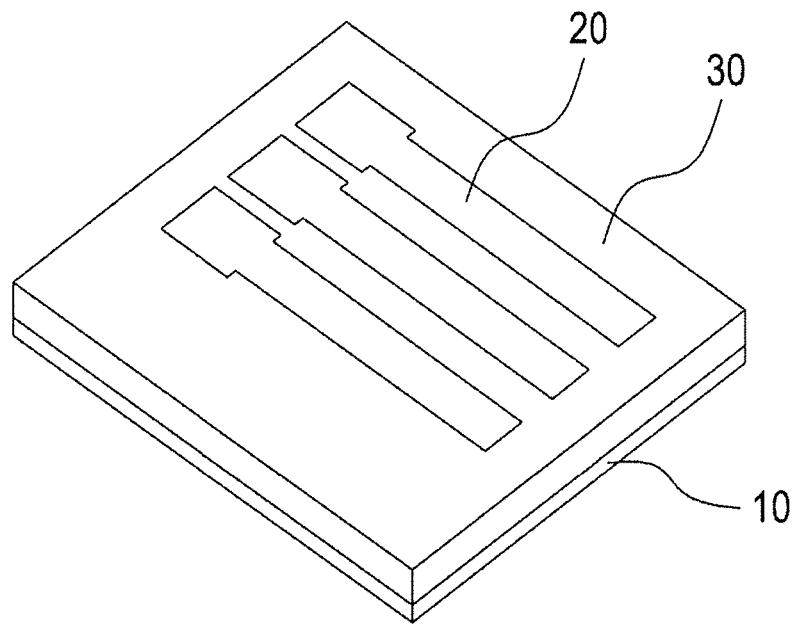
Figure 8:
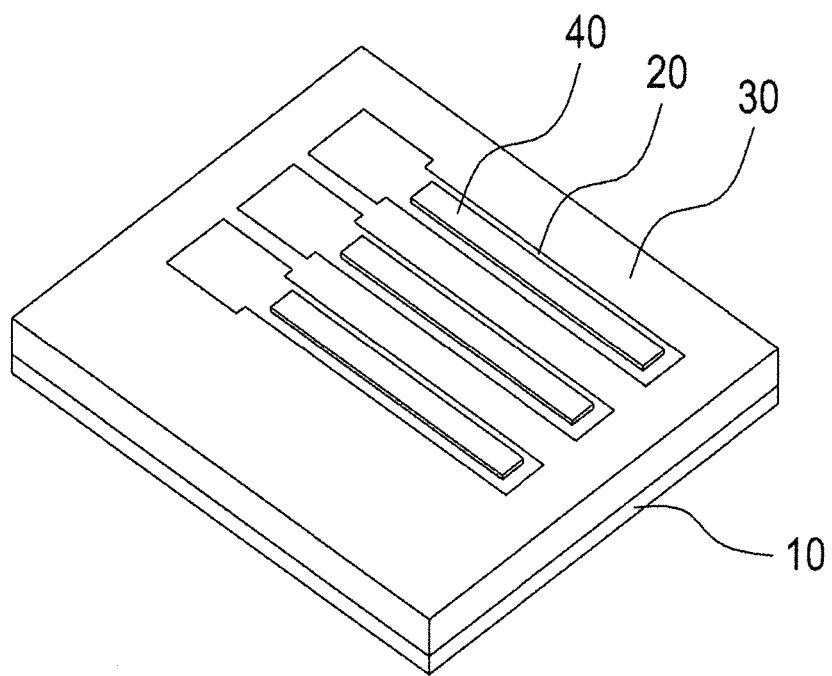
Figure 9:
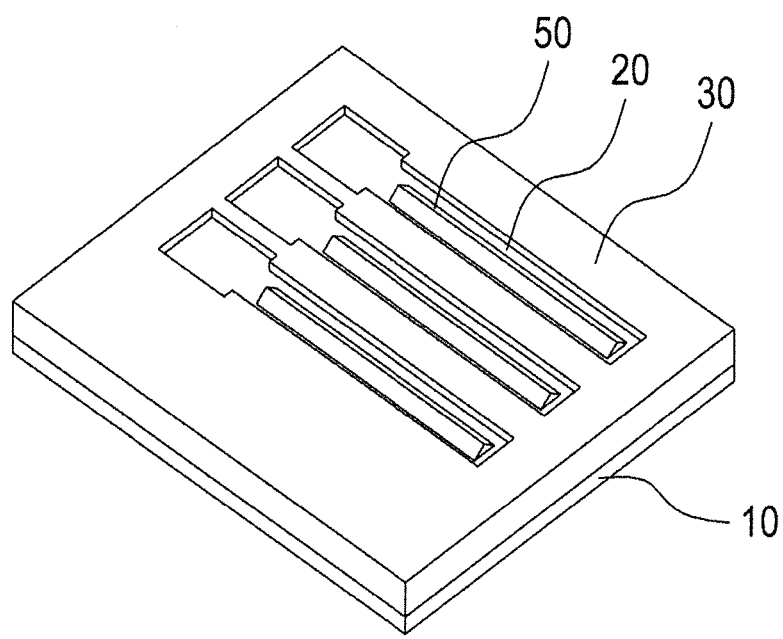

Here, each bit line 22, as shown in FIGS. 6 to 11B, can be formed in one body with the semiconductor substrate 10, each of the bit lines being a bottom electrode line doped with an impurity and electrically insulated from adjacent lines with an isolation insulating film 30. As shown in FIG. 9, the semiconductor lines 20 as the bit lines 22 have upwardly protruding tapered tip structures 50 along the first direction. When the semiconductor substrate 10 is a P-type substrate, the each bit line (BL) 22 can be formed of an N-type conductive line. Of course, the opposite can be formed.

As mentioned above, the tip structure 50 can have a polygonal cone shape, a conical cone shape or a wedge shape as shown in FIG. 16. In case that the tip structure 50 has the wedge shape, it may be configured to have a predetermined length in the first direction and a triangular cross-section in the second direction. Thus, it is preferred in a fabricating process that the tip structure 50 has the wedge shape for the top electrode (WL) 100 formed of a nanowire.

Because the tip structure 50 is formed to be tapered upwardly and to have a sharp upper end, the upper end size (i.e., minimum width) in the second direction (i.e., the direction of the word line 100) can be less than a few nanometer, as an example, 10 nm or less.

It is preferred that the top electrode (WL) 100 also is formed, as shown in FIG. 14, of a nanowire with a diameter less than several tens nm. The nanowire may be a metal nanowire, a carbon nanotube (CNT) or a grapheme nanoribbon.

Thus, as shown in FIG. 16B, it is possible that a top electrode (WL) 100 and a bottom electrode (BL) 22 are across each other at an area maximally reduced or minimized and an electric field can be focused to the upper end of the tip structure 50 of a bottom electrode (BL) 22. So, it is possible to solve the chronic reliability problem by forming a single conductive filament (CF) as shown in FIG. 16B or at least minimal numbers much less than those of the conventional resistive random memory device as shown in FIG. 16A in a resistance change layer (SL) 82.

An interlayer insulating film 70 further is formed between the plurality of bit lines 22 and the resistance change layer 80, as shown in FIGS. 11A-12B, the interlayer insulating film 70 wrapping around the tip structures except for upper parts 52 of the tip structures.

Because the interlayer insulating film 70 enables the exposed range of the upper part of the tip structure 50 to be determined by adjusting the stacking thickness of the insulating film, it is possible to secondarily and more effectively restrict a region where conductive filaments are formed.

Figure 12A:
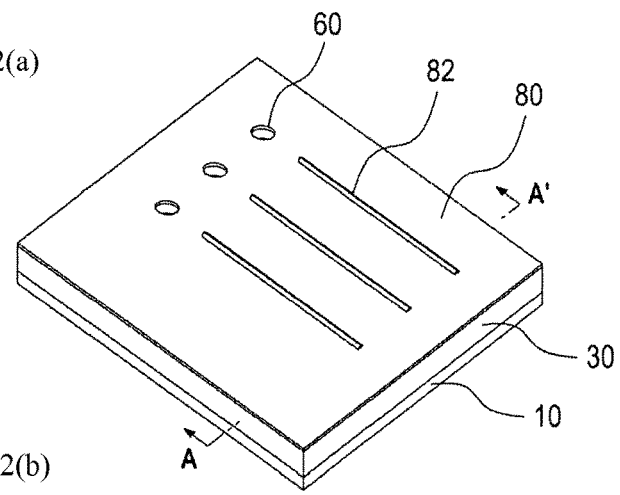
Figure 12B:
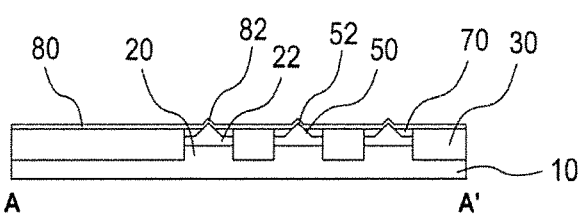
Figure 13:
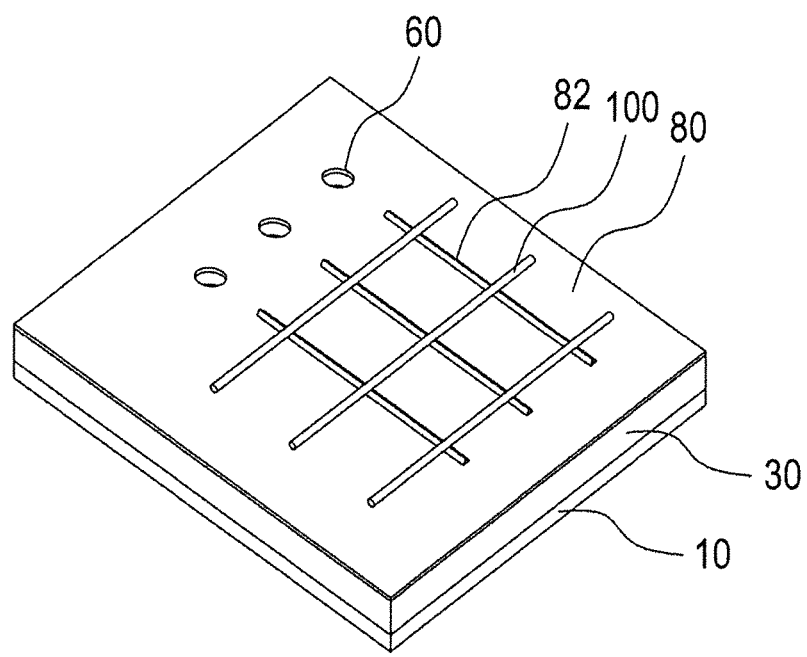

The resistance change layer 80, as shown in FIGS. 11A-12B, is formed on the upper parts 52 of the tip structures of the each bit line 22, the interlayer insulating film 70 and the isolation insulating film 30, and each of the word lines 100, as shown in FIGS. 13 to 15, is formed of a top electrode line passing over the tip structures 50 and 52 of the bit lines 22 along the second direction.

In FIGS. 14-15B, the reference numbers 91, 92, 101 and 102 indicate a bit line contact, a bit line contact plug, a word line contact and a word line contact plug, respectively.

Next, a detailed description of a fabrication method of a memory array according to an embodiment of the present invention is provided with reference to FIGS. 5 to 15B.

A fabrication method of a memory array according to an embodiment of the present invention is to fabricate the above mentioned memory array of the present invention.

Figure 1:
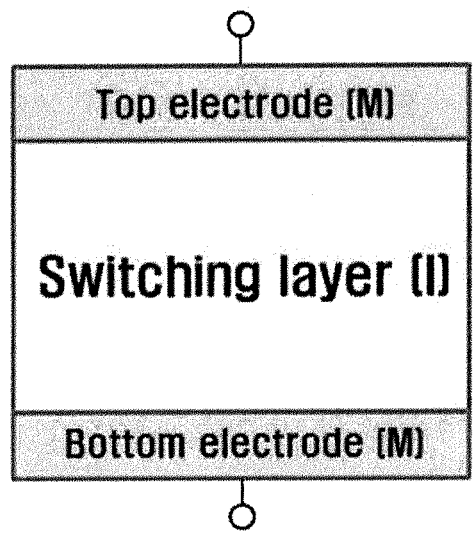
FIG. 1 is a cross sectional view showing a basic structure of the conventional resistive random access memory device.
Figure 2:
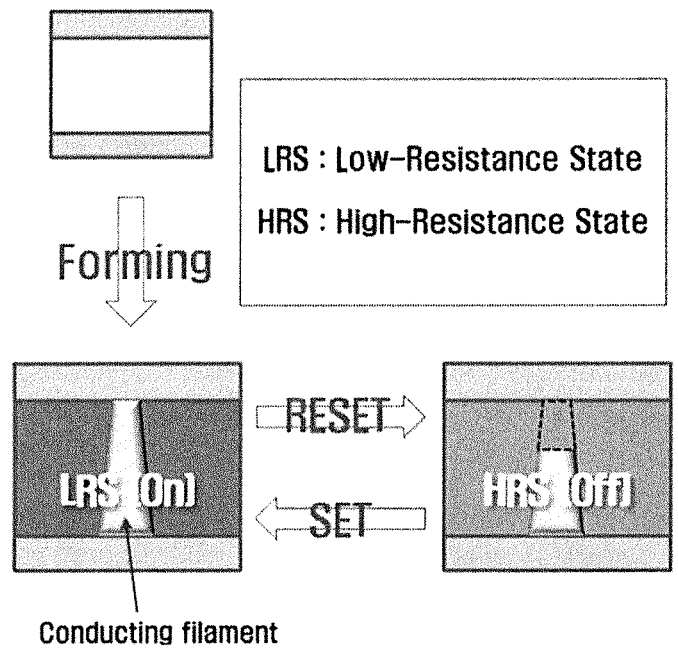
FIG. 2 is a concept diagram showing the switching operation characteristics of the conventional resistive random memory device having a structure shown in FIG. 1.
Figure 3:
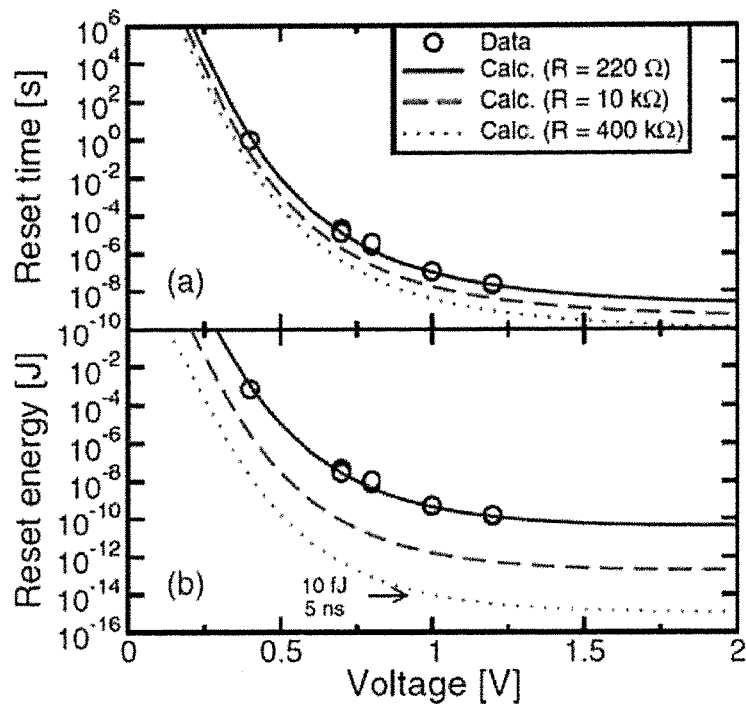
FIG. 3 is an electrical characteristic diagram showing the relationship of reset time and energy according to voltages applied to a resistive random memory device.
Figure 4:
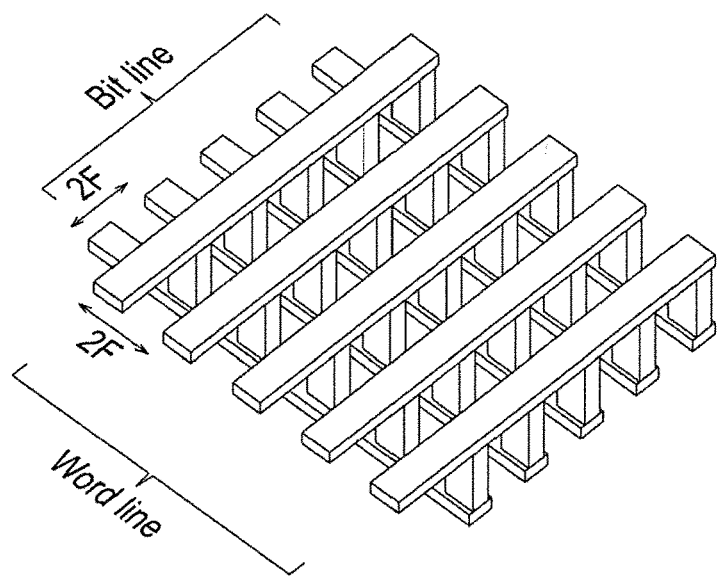
FIG. 4 is a memory array having a conventional resistive random memory device as a unit memory cell.
Figure 5:
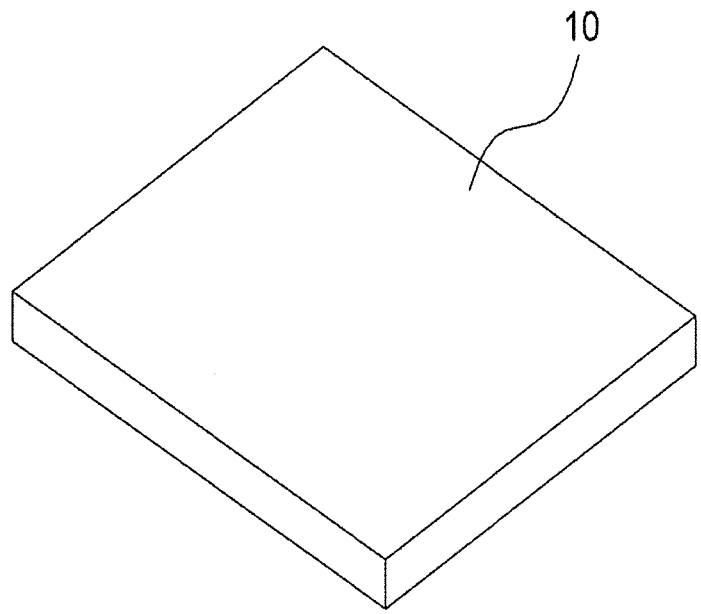
FIGS. 5 to 14 are process perspective views and cross sectional views taken along line AA' showing a fabricating process of a memory array according to an embodiment of the present invention.
Figure 6:
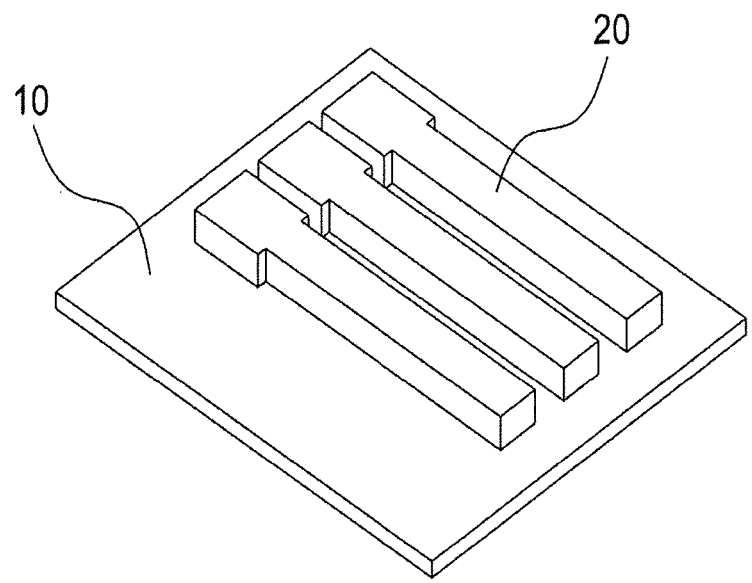

First, as shown in FIG. 5, after a semiconductor substrate 10 for fabricating a memory array is prepared, as shown in FIG. 6, a plurality of semiconductor lines 20 for forming a plurality of contacts and bit lines is protruded by etching the semiconductor substrate 10 (a first step). The semiconductor substrate 10 may be a silicon substrate, but it can be other semiconductor substrate such as a germanium substrate and the like.

Then, as shown in FIG. 7, an isolation insulating film 30 is formed by depositing a first insulating material on the semiconductor substrate 10 and etching the first insulating material to expose upper parts of the semiconductor lines 20 and to be insulated from each other (a second step). The first insulating material may be an oxide film. After depositing the first insulating material, it is preferable that the first insulating material is planarized by the known CMP process, etc. and etched to be exposed the upper parts of the semiconductor lines 20.

Next, as shown in FIG. 8, protruding patterns 40 are formed on the upper parts of the semiconductor lines 20 (a third step). The protruding patterns 40 can be formed by one of the following two processes. One process is to form tip structures by etching the protruding pattern itself 40. In this case, the protruding pattern 40 is formed of a semiconductor material such as the same or similar to the semiconductor substrate 10. The other is that the protruding patterns 40 are used as etching masks and the tip structures are formed by etching semiconductor lines exposed around the etching masks. In the latter case, although the etching masks may be used as dry masks, it is preferable to be used as wet masks formed of oxide or nitride. Specifically, for forming the etching masks, it is possible to use one process selected from photolithography, sidewall patterning and e-beam processes.

The shape of the tip structures can be determined according to that of the protruding patterns 40. Thus, the protruding patterns 40 may have a shape selected from a regular polygon such as a square, etc., a circle, an ellipse and a rectangle and be formed with a single or a plurality at a predetermined interval in a longitudinal direction of each semiconductor line 20. But, hereafter, because a nanowire is used to form a word line (WL) 100 as a top electrode, the tip structure 50, as shown in FIG. 16, preferably is formed of a wedge shape having a predetermined length in the first direction and a triangular cross-section in the second direction.

By this reason, the protruding patterns 40, as shown in FIG. 8, preferably can be formed with a single rectangle having a predetermined length in a longitudinal direction in each semiconductor line 20.

Next, as shown in FIG. 9, upwardly protruding tapered tip structures 50 are formed on the upper part of a portion that forms each bit line by using the protruding patterns 40 (a fourth step). Namely, in case that the protruding patterns 40 are formed of a semiconductor material, the tip structures 50 are formed by etching the protruding patterns 40 and the exposed semiconductor lines 20. While when the protruding patterns 40 are formed to be used as etching masks, the tip structures 50 are formed by etching the semiconductor lines exposed around the etching masks.

In FIG. 9, the tip structures 50 can be formed with a single wedge shape having a predetermined length and a triangular cross-section on each semiconductor line 20 as shown in FIG. 8.

In the fourth step, when the etching of the semiconductor lines 20 and/or the protruding patterns 40 is performed to form the tip structures 50, it is preferable to use an anisotropic etching. Here, the anisotropic etching means to have different etching rates according to the crystal planes of a semiconductor. It is different from non-isotropic etching to etch vertically in a clear direction such as a dry etching and also different from an isotropic etching to etch uniformly in all areas contacted with etchant. Among the anisotropic etchings, an anisotropic wet etching is more preferred. When the semiconductor lines 20 and/or the protruding patterns 40 are formed of a silicon, referring to FIGS. 18A and 19D, it is possible to embody a very sharp peak-type tip structure 50 having an upper end size (at a cross-section in the second direction, namely, minimum width) of a few nanometer nm, as an example, 10 nm or less by performing an anisotropic wet etching with etchant such as TMAH, KOH, etc.

FIG. 17 is a process concept diagram showing processes fabricating a wedge shaped tip structure by an anisotropic etching without etching masks after silicon is patterned as a fin shape. As mentioned above, in case that the protruding patterns 40 are formed of semiconductor material equal to or similar the semiconductor substrate 10, the wanted tip structure 50 can be formed by anisotropic etching without etching masks.

Figure 10:
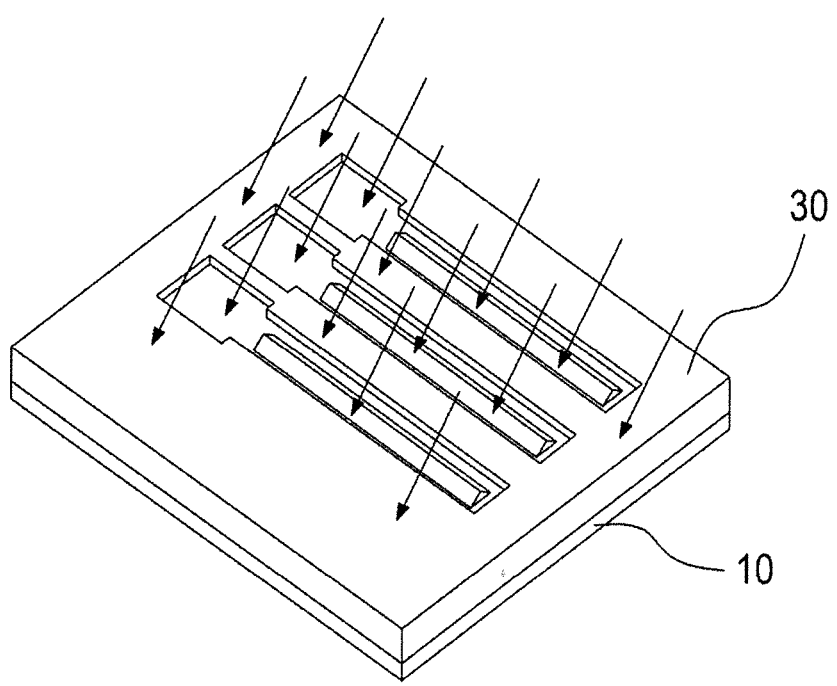

Next, as shown in FIG. 10, a plurality of contacts and bit lines are formed on the upper parts of the semiconductor lines 20 by performing an ion implantation process (a fifth step). Here, the ion implantation process is used to raise the electric conductivity of not only the protruding tip structures 50, but also the upper parts of the semiconductor lines 20 for forming the plurality of contacts and bit lines as conductive lines (namely, bottom electrodes). To be insulated from the lower parts of semiconductor lines 20 and the semiconductor substrate 10, the plurality of contacts and bit lines may be formed of an N-type when the semiconductor substrate 10 is a P-type substrate. Of course, the opposite can be formed.

Then, before the next step, as shown in FIGS. 11A and 11B, it is preferred that a second insulating material is deposited on the upper parts of the plurality of contacts and bits lines 22 and the isolation insulating film 30, and the second insulating material and the isolation insulating film 30 are etched to form an interlayer insulating film 70 with the second insulating material, the interlayer insulating film 70 wrapping around the tip structures except for upper parts 52 of the tip structures 50. If word lines 100 are formed of material that cannot wrap around the protruding tip structure 50 in a following process, this additional step can be omitted.

FIG. 11B is a cross sectional view taken along line AA' in FIG. 11A. As shown in FIG. 11B, because the exposed range of the upper part 52 of the tip structure 50 is determined by adjusting the thickness of the interlayer insulating film 70, it is possible to secondarily and more effectively restrict a region where conductive filaments are formed.

It is preferred that the second insulating material is the same as the first insulating material forming the isolation insulating film 30. At this time, the etching process of the second insulating material and the isolation insulating film 30 can be carried out after depositing and further planarizing the second insulating material. By doing so, as shown in FIG. 11B, because the interlayer insluting film 70 and the isolation insulating film 30 can be etched in a same horizontal plane, it is easy to protrude the upper parts 52 of the tip structures 50 of the each bit line 22.

Next, as shown in FIGS. 12A and 12B, a resistance change layer 80 or 82 is formed on the exposed upper parts 52 of the tip structures 50 of the each bit line 22, the interlayer insulating film 70 and the isolation insulating film 30 by depositing a resistance change material and a plurality of contact holes 60 that reach the each contact are formed (a sixth step).

Here, the resistance change layer 80 or 82 may be formed of a known resistance change material. The resistance change material can be deposited with a thickness more than the height of the tip structures 50 exposed from the interlayer insulating film 70 and planarized by a planarization process, CMP etc. and then a following process for forming the top electrodes (word lines) 100 can be carried out (not shown). As other embodiment, the resistance change layer 80 or 82 can be protruded upwardly on the tip structure 50, as shown in FIG. 12 A, and can be formed with a predetermined thickness as shown in FIG. 12B, and the protruding parts 82 of the resistance change layer 80 can be formed on the tip structures 50 exposed from the interlayer insulating film 70. In a following process, as shown in FIG. 13, the top electrodes (word lines) 100 can be formed to wrap the protruding parts 82 of the resistance change layer 80.

Then, as shown in FIGS. 15A and 15B, plural word lines 100 are formed of nanowires on the resistance change layer 82 and a plurality of word line contacts 101 and a plurality of bit line contacts 91 filled in the plurality of contact holes are formed (a seventh step).

Here, each word line 100 can be formed by transferring a metal nanowire, a carbon nanotube (CNT) or a graphene nanoribbon.

FIGS. 19A-19D show a process concept diagram showing an example of forming word lines 100 by transferring carbon nanotubes 110 in a vertical direction against the tip structure 50 on a protruding resistance change layer 82 covering a nano-wedge shaped tip structure 50 by a fabricating process of a memory array according to an embodiment of present invention.

FIG. 19A shows single-walled carbon nanotubes (SWNT) 110 grown by mercury on a quartz substrate 1, FIG. 19B shows a thin film 2 formed with polymer coating such as a gold film or polymethyl methacrylate (PMMA) on the carbon nanotubes 110, FIG. 19C shows a procedure for detaching the thin film 2 from the quarts substrate 1 by an adhesive tape, and FIG. 19D shows a transferring the detached carbon nanotubes 110, as an example, tape/PMMA/SWNT 2, on the protruding resistance change layer 82 covering the nano-wedge shaped tip structure 50 of the semiconductor substrate 10 in a vertical direction against the tip structure 50. Thus, after the above mentioned process, the tape is slowly detached on a hot plate of 100° C. and finally PMMA is removed by acetone. Thus, SWNT 110 synthesized on the quarts substrate 1 is fully transferred as the word lines 100.

FIGS. 20A-21B show that metal nanowires having a wanted diameter can be uniformly produced by using an electrodeposition of nano-particles depending on electrochemical step edge decoration (ESED) along each step edge on highly ordered pyrolysis graphite (HOPG) having a step layer structure with a uniform biased step edge of graphene. More information can be referred to the contents published in CHEMPHYSCHEM 2003. 4, pp. 131-138.

In this case, as shown in FIGS. 19A-19D, the gold or PMMA film can be also formed on the HOPG substrate and the metal nanowires can be transferred to word lines 100 of memory array according to the present invention by using a an adhesive tape as Scotch tape, etc.

What is claimed is:

1. A memory array comprising:
   a semiconductor substrate;
   a plurality of bit lines disposed on semiconductor lines, the bit lines being formed by etching upper portions of the semiconductor lines to have upwardly protruding tapered tip structures, the semiconductor lines being etched from an upper portion of the semiconductor substrate such that the bit lines and the semiconductor lines form one body with the unetched portion of the semiconductor substrate, the bit lines and the semiconductor lines extending in a first direction and being oppositely doped to form a pn junction, respectively; and
   a plurality of word lines formed in a second direction across the bit lines, a resistance change layer being located between the word lines and the bit lines,
   wherein each of the bit lines is formed of a semiconductor line doped with an impurity, the semiconductor line having upwardly protruding tapered tip structures, and
   wherein each of the word lines is formed of a nanowire passing over the tip structures of the bit lines along the second direction.

2. The memory array of claim 1, wherein the bit lines are formed in one body with the semiconductor substrate, each of the bit lines being a bottom electrode line doped with an impurity and electrically insulated from adjacent lines with an isolation insulating film, the bottom electrode line having upwardly protruding tapered tip structures along the first direction,
   wherein an interlayer insulating film is further formed between the bit lines and the resistance change layer, the interlayer insulating film wrapping around the tip structures except for upper parts of the tip structures,
   wherein the resistance change layer is formed on the upper parts of the tip structures of the each bit line, the interlayer insulating film and the isolation insulating film, and
   wherein each of the word lines is formed of a top electrode line passing over the tip structures of the bit lines along the second direction.

3. The memory array of claim 1, wherein the tip structures have a wedge shape, the wedge shape being configured to have a predetermined length in the first direction and a triangular cross-section in the second direction, and wherein the nanowire is a metal nanowire, a carbon nanotube (CNT) or a graphene nanoribbon.

* * * * *